(12) United States Patent
Bauer et al.

(10) Patent No.: US 9,006,868 B2
(45) Date of Patent: Apr. 14, 2015

(54) ENCAPSULATION OF AN MEMS COMPONENT AND A METHOD FOR PRODUCING SAID COMPONENT

(75) Inventors: Christian Bauer, München (DE); Hans Krüger, München (DE); Jürgen Portmann, München (DE); Alois Stelzl, München (DE)

(73) Assignee: EPCOS AG, Munich (DE)

( * ) Notice: Subject to any disclaimer, the term of this patent is extended or adjusted under 35 U.S.C. 154(b) by 28 days.

(21) Appl. No.: 13/976,420

(22) PCT Filed: Nov. 18, 2011

(86) PCT No.: PCT/EP2011/070470
§ 371 (c)(1),
(2), (4) Date: Sep. 6, 2013

(87) PCT Pub. No.: WO2012/089408
PCT Pub. Date: Jul. 5, 2012

(65) Prior Publication Data
US 2013/0341773 A1 Dec. 26, 2013

(30) Foreign Application Priority Data

Dec. 28, 2010 (DE) .......................... 10 2010 056 431

(51) Int. Cl.
*H01L 23/552* (2006.01)
*B81B 7/00* (2006.01)
(Continued)

(52) U.S. Cl.
CPC ........... *B81B 7/0064* (2013.01); *H01L 23/3121* (2013.01); *H03H 3/02* (2013.01);
(Continued)

(58) Field of Classification Search
CPC ... H01L 23/552; H01L 23/29; H01L 23/3142; H01L 23/3121; B81B 7/0064
USPC ........................... 257/659, 710, 711; 438/121
See application file for complete search history.

(56) References Cited

U.S. PATENT DOCUMENTS 5,750,926 A * 5/1998 Schulman et al. ............ 174/564
7,544,540 B2   6/2009 Bauer et al.
(Continued)

FOREIGN PATENT DOCUMENTS

DE   19806818 C1   11/1999
DE   10164494 A1   7/2003
(Continued)

OTHER PUBLICATIONS

APIC Yamada Corporation, "Ultra thin layer by electrostatic atomization," 2009.
(Continued)

*Primary Examiner* — Tu-Tu Ho
(74) *Attorney, Agent, or Firm* — McDermott Will & Emery LLP

(57) ABSTRACT

The invention relates to a component and a method for producing said component. The component comprises a substrate (S), a chip (CH), a frame (MF), which is connected to the substrate (S) and on which the chip (CH) bears. A metallic closure layer (ML) encompasses the frame (MF), the substrate (S) and the chip (CH) such that a volume enclosed by the substrate (S), the chip (CH) and the frame (MF) is hermetically sealed.

7 Claims, 3 Drawing Sheets

Figure 1:
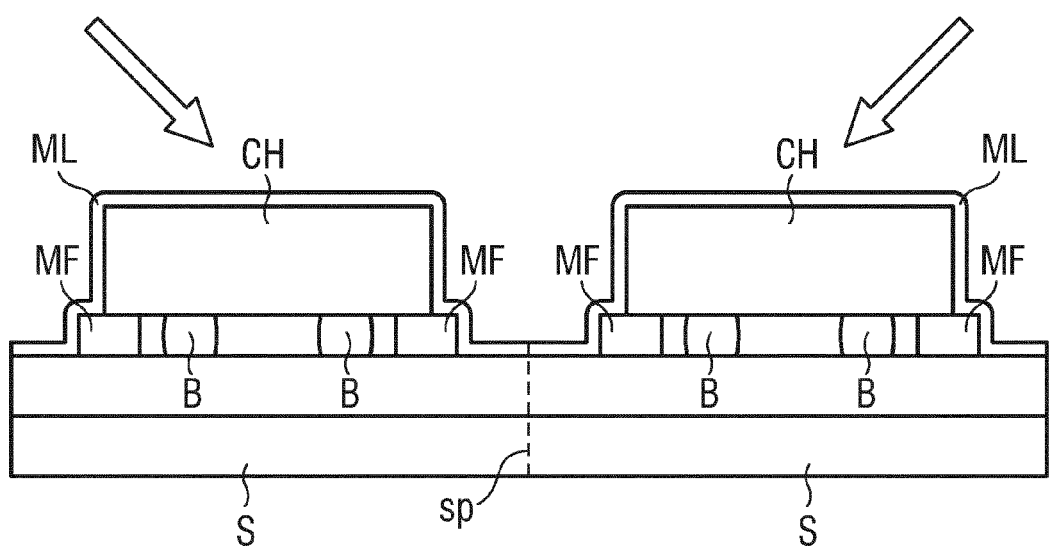

(51) Int. Cl.
*H03H 3/02* (2006.01)
*H03H 9/10* (2006.01)
*H01L 23/29* (2006.01)
*H01L 21/56* (2006.01)
*H01L 25/065* (2006.01)
*B81C 1/00* (2006.01)
*H01L 23/31* (2006.01)

(52) U.S. Cl.
CPC ............... *H03H 9/10* (2013.01); *H01L 23/29* (2013.01); *H01L 23/3142* (2013.01); *H01L 21/561* (2013.01); *H01L 23/552* (2013.01); *H01L 2224/16225* (2013.01); *H01L 25/0655* (2013.01); *B81C 1/00333* (2013.01); *H01L 2924/1461* (2013.01)

(56) References Cited

U.S. PATENT DOCUMENTS

| | | | |
|---|---|---|---|
| 8,076,827 | B2 | 12/2011 | Saitou et al. |
| 8,404,516 | B2 | 3/2013 | Bauer et al. |
| 2006/0151203 | A1 | 7/2006 | Krueger et al. |
| 2010/0127377 | A1 | 5/2010 | Bauer et al. |
| 2011/0272796 | A1* | 11/2011 | Eaton et al. .................. 257/682 |

FOREIGN PATENT DOCUMENTS

| | | |
|---|---|---|
| DE | 10238523 A1 | 3/2004 |
| DE | 102004020204 A1 | 11/2005 |
| DE | 102006025162 B3 | 1/2008 |
| DE | 102007025992 A1 | 12/2008 |
| DE | 102007043291 A1 | 4/2009 |
| EP | 900477 A1 | 3/1999 |
| JP | 2007-074418 A | 3/2007 |
| JP | 2007-533475 A | 11/2007 |
| JP | 2010074418 | 4/2010 |
| JP | 2010-528881 A | 8/2010 |
| WO | 2005/102910 A1 | 11/2005 |

OTHER PUBLICATIONS

Reinhausen Plasma, "Plasmadust," Apr. 2010.

* cited by examiner

FIG 3
(A)
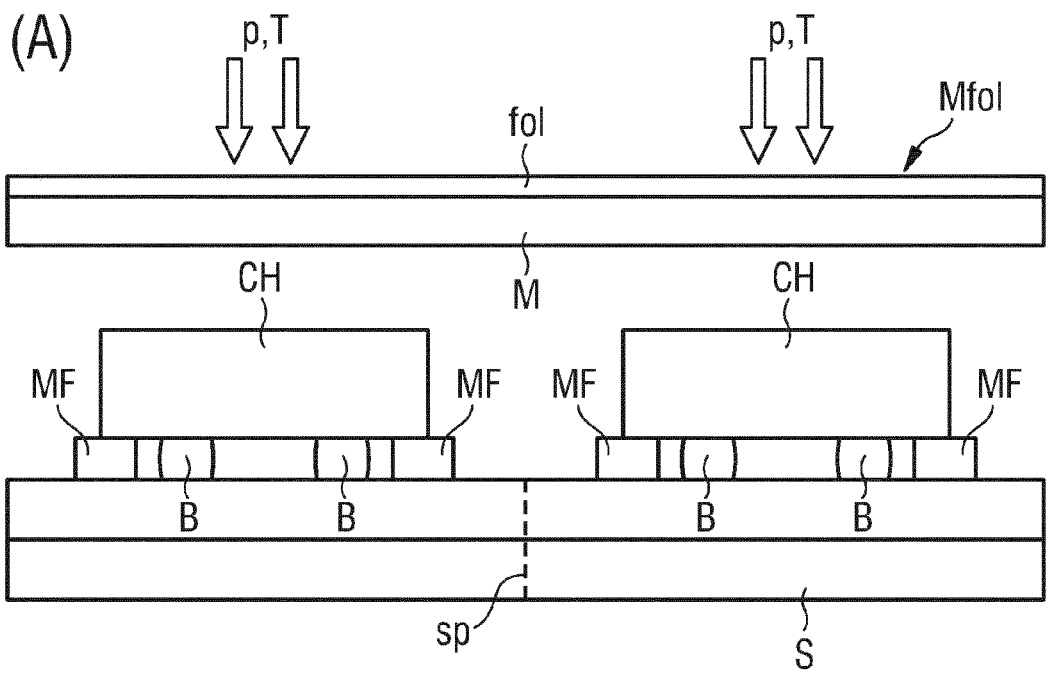
(B)
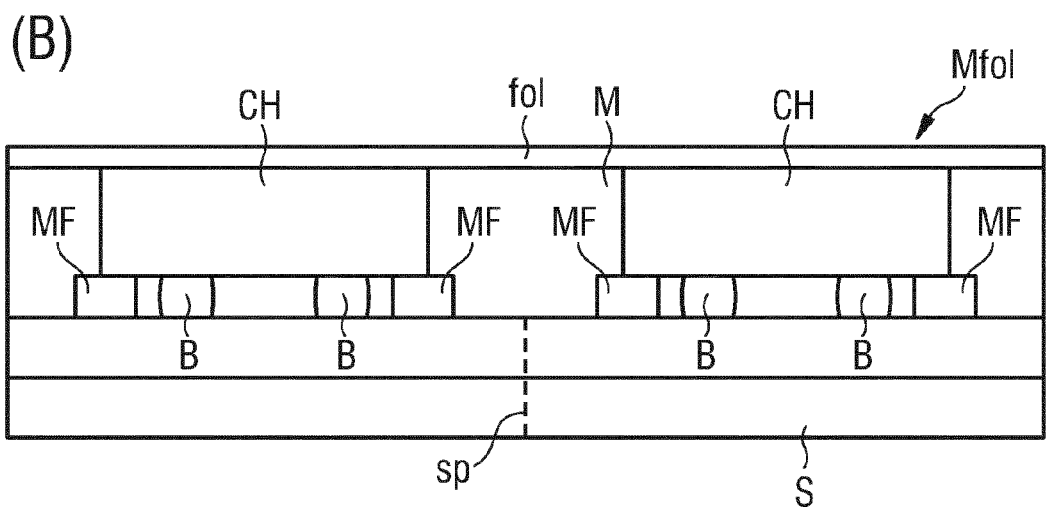

ENCAPSULATION OF AN MEMS COMPONENT AND A METHOD FOR PRODUCING SAID COMPONENT

The invention relates to a component and a method for producing a component.

Components of the type of a microelectromechanical system (MEMS), a microelectro-optical system (MEOPS) or a microelectro-optomechanical system (MEOMS) have a chip, which has function carriers connected to conductor tracks and is mounted on a carrier substrate. The functionality of a surface acoustic wave filter chip is achieved in that an electroacoustic transducer transforms electrical input signals into acoustic waves which propagate in the chip material, such as in a piezoelectric substrate, for instance. In this case, acoustic waves can occur at the surface and are also called "surface acoustic waves" or SAW. If the acoustic waves propagate in the entire ensemble, then "bulk acoustic waves" are present. From these acoustic waves, characteristic output signals can be converted again into electrical output signals by means of a further transducer. Components which function according to this principle have outstanding filter or resonator properties. They are therefore predestined to be used in many technical areas such as wireless communication and sensor technology.

For disturbance-free propagation of the acoustic waves, various protection mechanisms have to be implemented. A housing and a cavity afford mechanical protection. In addition, a functioning component requires protection against ambient influences, such as temperature and moisture. For this reason, an encapsulation of the elements is required. In particular, it is important to be able to operate the component even in the case of frequent thermal cycles and high temperatures. Methods for producing the component and its protection mechanisms should, in order to satisfy modern requirements, lead to a minimized structural size. Economic production associated with few process steps and low material consumption is also required in this context. It is desirable here to be able to realize a plurality of functions, such as sealing and shielding of the component, for instance, with individual process steps of the production method.

It is an object of the present invention to provide a component and a method for producing a component which requires few process steps and which, in particular, realizes a plurality of functions with individual process steps.

The object is achieved by means of the independent claims. The dependent claims respectively relate to developments and configurations.

In one embodiment, a component comprises a substrate, a chip and a frame, which is connected to the substrate. Preferably, the substrate is gastight and comprises ceramics such as high temperature cofired ceramic or HTCC or low temperature cofired ceramics or LTCC. It is furthermore preferred for the chip to comprise quartz, lithium tantalate, lithium niobate or similar substances and to bear functional elements, for example transducers for surface or bulk acoustic waves. For this purpose, said chip comprises, for example, a piezoelectric material, electroacoustic transducers and suitable conductor tracks.

The frame on the substrate is preferably produced from copper, nickel, silver or a sequence of these metals and is connected to the substrate in a gastight manner. Other materials for the frame, such as some ceramic, are likewise conceivable. The frame is designated as metallic frame hereinafter. The chip bears on the metallic frame. Furthermore, it is preferred for the metallic frame to have a planar surface for example by means of diamond milling. As a result, it is possible that for example a chip provided with bump connections, after flip-chip or turning mounting and collapsing of the bump connections in a subsequent reflow process, bears uniformly on the metallic frame and the gap between chip and metallic frame given appropriately adapted frame heights, bump connection heights and collapsing is almost zero. By means of pressurization of the chip with melted bump connections and cooling below the melting point of the bumps with sustained pressurization, the gap between chip and frame can be minimized and, in the case of diamond-milled frames, can be less than 10 nm.

Furthermore, a metallic closure layer is provided, which encompasses the metallic frame, the substrate and the chip such that a volume enclosed by the substrate, the chip and the metallic frame is hermetically sealed.

Advantageously, the component in the form of the enclosed volume or a cavity is hermetically closed in relation to environmental influences by the use of the metallic closure layer. As a result of the chip bearing on the metallic frame, it is furthermore possible to achieve the hermetic sealing of the cavity with few process steps. In this way, however, it is also possible to combine different functions, such as shielding and sealing, in one process step. Together with the application of the metallic closure layer, the gap between the metallic frame and the chip is closed. Moreover, in one exemplary embodiment, the metallic closure layer functions as a crystallization nucleation layer or "seed layer" for subsequent plating which realizes a further hermeticity electromagnetic shielding.

Furthermore, the behavior of the component is improved during thermal cycles after the component has been mounted for example onto substrates such as PCB or LTCC. Furthermore, it is possible to realize reduced structural sizes with the same filter functions of the chip. Since the number of required process steps is small, more components per panels can be obtained with the same functionality, or else larger chips can be realized with the same panel occupancy.

In a further embodiment, the metallic closure layer comprises one metal layer or a sequence of metal layers.

By virtue of the provision of an individual metal layer or a sequence of metal layers, the metallic closure layer can be adapted to the specific use of the component in wide ranges. What can be achieved by means of a suitable choice of the melting points in the individual metal layers, for example, is that, by combining metals having low and high melting points, a gastight metal alloy which does not melt even at medium to high temperatures is formed. The thickness of the layers can be chosen within wide ranges and enables a further adaptation to the respective application.

According to a further embodiment, the metallic closure layer bears on the metallic frame, the substrate and the chip over the whole area.

By virtue of the metallic closure layer being embodied over the whole area, in particular structural measures required for sealing the gap are obviated. Furthermore, the thickness of the metallic closure layer can be chosen within wide ranges, in particular between 10 and 40 μm, and further functions can thus be assigned to the metallic closure layer. In case of use in mobile radio, for example, the metallic closure layer also takes on shielding properties. With a suitable layer thickness, even high-frequency electromagnetic radiation can be shielded. Furthermore, the metallic closure layer has electrical properties and, for instance, excess charges such as typically occur on the chip can be dissipated.

In a further embodiment, the chip has electrically conductive structures on a side inclined toward the enclosed volume and is electrically interconnected with the substrate by means of bump connections.

In a further embodiment, the metallic frame has a planar surface, such that the chip bears homogeneously on the metallic frame. The latter is planarized for example by diamond milling or other suitable prior processes, such that the chip bears uniformly on the metallic frame. In this case, the surface of the metallic frame is preferably processed such that a gap between metallic frame and chip is as small as possible or almost zero.

Advantageously, the distance between the frame and the chip is almost zero. This is achieved in the case of a planarized frame by means of sufficient collapsing of the bump connections in a reflow process or by uniform pressurization of the chips in the melted state of the bump connections and cooling with pressurization. Gaps between chip and frame that are smaller than 10 nm can be obtained by this means. Said gaps also remain after cooling if the coefficient of thermal expansion of the material of the bump connection is greater than that of the frame material. Nanometals can then also be applied by the spraying method and sintered by heat treatment to form homogenous metal layers.

In a further embodiment, the bump connection has a coefficient of thermal expansion that is greater than a coefficient of thermal expansion of the metallic frame.

Preferably, the chip is pressed on the metallic frame by pressurization. By means of the soldering of the bump connection at higher melting temperatures, the involved materials of the chip and respectively of the metallic frame expand. The chip is pressed onto the metallic frame during cooling when the materials contract on account of their different coefficients of expansion.

According to a further embodiment, the chip is a microelectromechanical system, a microelectro-optical system or an microelectro-optomechanical system.

According to a further embodiment, the metallic closure layer comprises one or more materials. Possible starting materials in this case include metal particles, in particular metallic nano- or microparticles, a metal foil or a metal alloy. Suitable metals comprise silver, gold, copper, and tin, this selection not being restrictive.

According to a further embodiment, the metal alloy comprises at least two different metals, the respective melting points of which are chosen such that the metal alloy becomes gastight by means of heat treatment or fusion.

In one embodiment of a method for producing a component comprising a substrate, a chip and a metallic frame, the following steps are provided. Firstly, the substrate connected to the metallic frame is applied. The chip is connected to the metallic frame by the chip bearing onto the metallic frame. Finally, a volume enclosed by the substrate, the chip and the metallic frame is hermetically sealed by means of a metallic closure layer. In this case, the metallic closure layer encompasses the chip and the metallic frame.

Advantageously, an enclosed volume or a cavity at the component is hermetically closed in relation to environmental influences by the use of the metallic closure layer. By placing the chip onto the metallic frame, it is furthermore possible to achieve the hermetic sealing of the cavity with few process steps. The metallic closure layer at least partly covers the substrate, the chip and the metallic frame and in this case combines different functions. Together with the application of the metallic closure layer, the residual gap between the metallic frame and the chip is closed. Moreover, the metallic closure layer can constitute a crystallization nucleation layer or a "seed layer" and additionally bring about electromagnetic shielding. Primarily in the case of sprayed-on and sintered nanometal layers usually having a smaller layer thickness, the metallic closure layer constitutes a seed layer for further processes which in turn serve to reinforce this closure layer.

Furthermore, the method according to the invention achieves an improved behavior in the case of thermal cycles after the component has been mounted for example on the substrates such as PCB or LTCC. Furthermore, it is possible to realize reduced structural sizes whilst maintaining the filter functions of the chip. Since the number of required process steps is small, it is therefore possible to obtain more components per panels with the same functionality or else to realize larger chips with the same panel occupancy.

In a further embodiment, the hermetic sealing by means of the metallic closure layer is effected by the metallic closure layer being applied on the metallic frame and the chip over the whole area and also of the substrate.

Advantageously, a whole-area embodiment of the metallic closure layer, in an individual process step, allows the cavity of the component to be hermetically closed and at the same time also allows the gap between the metallic frame and the chip to be closed. Moreover, the whole-area metallic closure layer can constitute a crystallization nucleation layer or a "seed layer" and an electromagnetic shielding.

In a further embodiment, the metallic closure layer is constructed from an individual metal layer or from a sequence of a plurality of metal layers.

By means of the layer construction, it is possible for the thickness and composition of the metallic closure layer to be varied and adapted to the respective task area. In particular, total thicknesses of greater than 40 µm are possible.

According to a further embodiment, the metallic closure layer is applied alternatively or in combination by means of a plasma jet, by means of spraying of metal particles dissolved in a solvent, by means of vapor deposition of one or a plurality of metals, or by means of fusion of a multilayer metal foil with pressurization.

Applying the metallic closure layer by means of a plasma jet is preferably effected by metal particles, in particular metallic nano- or microparticles, being admixed with the plasma or process gas. The metallic closure layer can furthermore be produced by means of a metal alloy. Application by means of fusion of the multilayer metal foil with pressurization is preferably effected by a multilayer metal foil being fused onto the component.

In a further embodiment, the metallic closure layer is reinforced by plating.

The invention is explained below on the basis of a plurality of exemplary embodiments with reference to figures. Insofar as parts or components correspond in terms of their function, the description thereof will not be repeated in each of the following figures.

Figure 2:
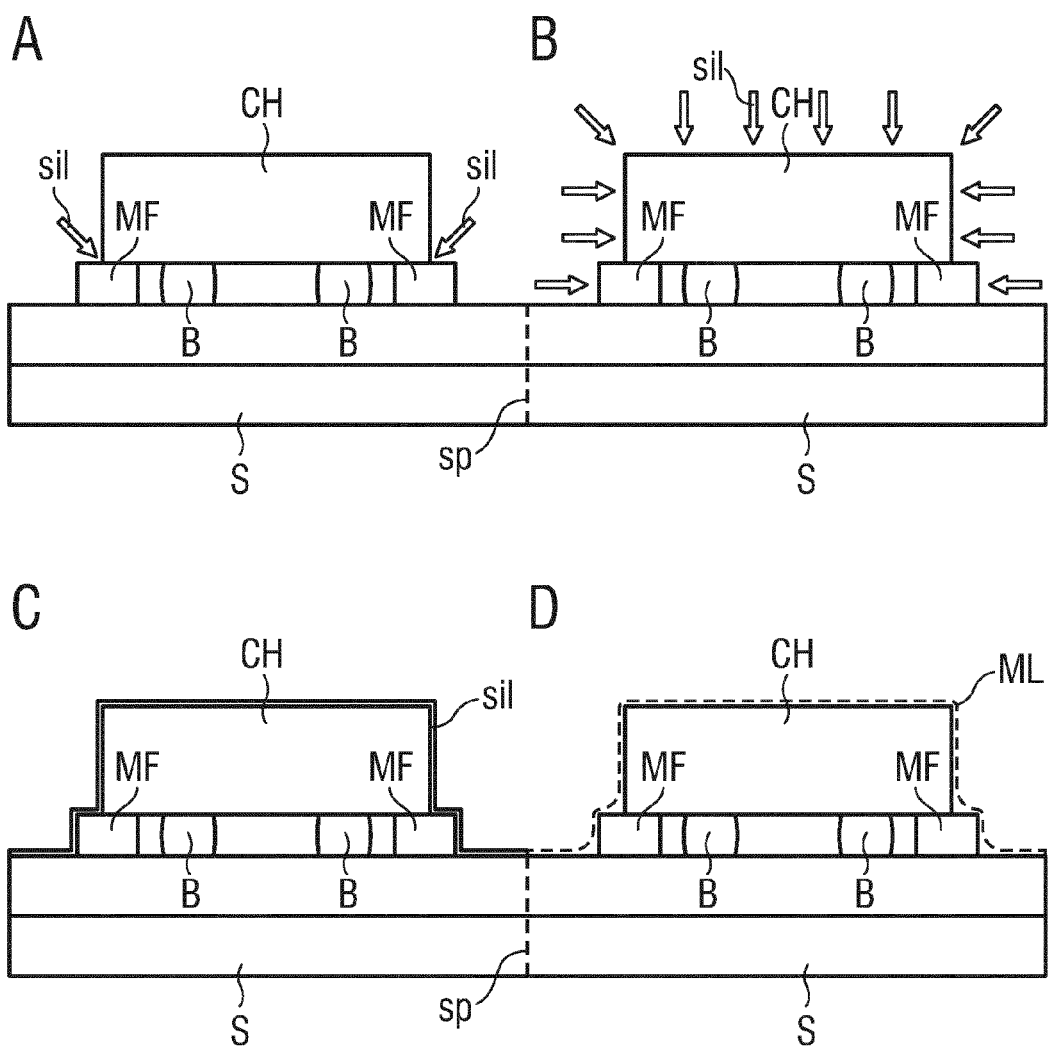

In the figures:

FIG. 1 shows an exemplary embodiment of a component according to the proposed principle, FIG. 2 shows an exemplary embodiment of a component with different process steps according to the proposed principle, and FIG. 3 shows an exemplary embodiment with a metallic foil according to the proposed principle.

FIG. 1 shows an exemplary embodiment of a component according to the proposed principle. The illustration shows a component such as can be produced and mounted together with a plurality of similar components on a panel. A sawing track SP is indicated, along which components mounted on a common substrate S can be separated. A component is assigned a circumferential metallic frame MF on the substrate S. A chip CH bears on said frame, said chip additionally being electrically interconnected with the substrate S by means of bump connections B.

Preferably, the metallic frame MF comprises copper or similar metals and was milled in an approximately planar fashion in a first processing step. This can be effected by diamond milling, for example. By means of flip-chip technology and subsequent reflow, the chip CH is connected to the metallic frame MF. The metallic frame MF is embodied in a planar fashion at the surface, such that the distance between chip CH and metallic frame MF is almost zero.

Alternatively or supplementarily, the component can be cooled with pressurization. As a result, the chip CH can additionally be pressed onto the metallic frame MF if, for example, the coefficient of thermal expansion of the bump connection B is chosen to be greater than the coefficient of thermal expansion of the metallic frame MF.

In an independent step, the chip CH was previously provided with conductor tracks allowing the chip to be used as an MEMS or a similar system. In order to reduce the required area of the chip CH, the latter can have conductor track crossings. The required area of the chip is reduced by these conductor track crossings. The required area for a component is furthermore minimized by virtue of the fact that, in the procedure according to the invention, the required frame width can be chosen to be minimal, i.e. sufficient for the chip to bear fully on the frame and for the frame to terminate at least with the chip edges. Benzocyclobutane (BCB) or other suitable plastics should be provided as insulation layer between mutually crossing conductor tracks.

The chip CH bearing on the metallic frame MF forms together with the substrate S a cavity, that is to say an encompassed volume. The latter is necessary for example for the use of chips CH with acoustic surfaces or bulk acoustic waves. For correct long-term functioning of the chip CH, it is furthermore necessary for the enclosed cavity to be hermetically closed, that is to say gastight and shielded against environmental influences. For this purpose, a metallic closure layer is applied at the connection between metallic frame MF and chip CH, said metallic closure layer sealing the substrate S, the chip CH and the metallic frame MF preferably over the whole area. In this way, it is advantageously possible to protect the chip surface situated in the cavity against contaminations and corrosion. The metallic closure layer preferably has a thickness of between 10 and 45 μm, and the metallic frame can have a height of up to 70 μm.

FIG. 1 indicates by means of arrows how the metallic closure layer is applied to the component. In principle, various procedures are possible. A plasma method is preferably used. With the aid of the plasma, nano- or micrometal particles, for instance, are applied to the component at a specific angle, preferably approximately 45°. This ensures that side faces of the chip CH are also coated sufficiently.

Said metal particles reach the component by means of a plasma jet. The term plasma jet denotes plasma flows having a jet form. Said plasma flow is generated in a device and extracted therefrom. In this case, the plasma preferably extends as far as the surface of the component. The generation of the actual plasma in jet form can take place in various ways, in principle. A dielectric barrier discharge or an arc discharge is possible.

The generated plasma flow in the form of a plasma jet is effected with an ionized process gas as carrier gas with exclusion of the ambient air and preferably in a separate spatial region. For this purpose, for instance, the process gas is guided into a reaction chamber, metal particles being admixed with the carrier gas. The process gas activated in this way passes into contact with the surface of the component by means of an exit nozzle, in order to deposit the admixed metal particles on the surface of the component to form the metallic closure layer.

A solvent-free direct coating of metals is thus advantageously possible. The metallic closure layer is configured particularly homogeneously in this way. The particular property of this technology is a low temperature and a low particle velocity. Continuous layers can thus be produced on thin temperature-sensitive substrates.

The metal particles adhere on the component on account of atomic and molecular interactions. Agglomerate-free metal particles in the micrometer and sub-micrometer range composed of copper, aluminum, zinc, tin, nickel, silver and gold can be used as starting powders. Air, nitrogen and argon and, in mixed additions, hydrogen and oxygen are possible as carrier gases. The plasma can be generated according to the inverter principle by means of a highly actively pulsed arc discharge.

Layer sequences composed of metals and/or metal alloys can also be applied by means of the plasma method. Thus, for instance, layers are possible which have a melting point of less than 260° C., for instance, and other metals which have a melting point of greater than 260° C. If the component is then subsequently heated above the melting point of the metal having a low melting point or correspondingly of the metal alloy having a low melting point, this results in the formation of gastight metal alloys which do not fuse at reflow temperatures of less than 270° C. in the case of suitable metal layer combinations. As described below in connection with FIG. 2, similar layer sequences can also be applied by means of spraying on metals.

FIG. 2 shows a component according to the proposed principle, as described structurally in FIG. 1. The illustration furthermore shows different, alternative or combinable process steps which can be used in connection with spraying on metal particles, in particular nano- and micrometal particles. Possible particles are, in particular, metals having a high melting point, such as silver and copper, or else metals having a low melting point, such as indium and tin. These metal particles are generally dissolved in a volatile organic solvent such as alcohol, for instance.

In order to enable the particles to stick better for instance by adhesion to the component and to prevent metal particles, precisely nanoparticles, from penetrating into the gap between chip and metallic frame, various surface functionalizations can be performed. In particular, a silanization can be used for functionalizing the surface.

In the process step identified by (A), a silanization is applied to the gap between metal frame MF and the chip CH by means of a jet or inkjet method. In particular, the jetting can be effected along defined regions and thus prevent the penetration of sprayed-on metal particles in a targeted manner. This is particularly advantageous along the bearing area between chip CH and metal frame MF.

Alternatively, in the process step identified by (B), a surface functionalization can be effected from a gas phase, for instance in a reaction chamber. In certain regions, silane can then subsequently be removed selectively by applying a plasma or by backsputtering.

In the process step identified by (C), individual parts, such as, for instance, the metal frame MF or the chip CH, are already surface-functionalized chemically prior to mounting.

In process step (D), the metal particles are sprayed on directly. This can be effected with the aid of surface functionalization or else without the latter.

After the nanoparticles have been sprayed on and thus form the metallic closure layer, it is expedient to subject the component to heat treatment. For this purpose, temperatures far below the melting point of the metal materials involved are applied over a relatively long time duration. It may subsequently be expedient for the metallic closure layer thus produced to be further reinforced by plating and for the layer thickness thus to be increased. It is furthermore also possible to use not only one, but also a plurality of different nanoparticles.

As an alternative to the jet or inkjet technique and in a manner not shown in the figures, the metallic closure layer ML can also be implemented by vapor deposition in a suitable reaction area. Suitable metals comprise titanium, copper and nickel. However, this selection is not restrictive.

FIG. 3 shows a further exemplary embodiment of a component according to the proposed principle using a multilayer metal foil Mfol. With suitable application of pressure and temperature p, T, as indicated by arrows in the figure, in a first process step A, the multilayer metal foil Mfol is placed onto the components. By means of the heating of a metallic portion M, having a low melting point, of the multilayer metal foil MFOL, this material becomes liquid and settles around the chip CH, the chip CH being soldered to the metallic frame MF, and seals the component over the whole area. The foil fol is left substantially bearing on the chips CH. After the cooling of this structure, the metallic closure layer hermetically seals the component.

By way of example, metal foil Mfol are suitable which comprise metal layers M which melt below 300° C., such as Sn, AuSn. In this case, the liquefied metal layer M at the interface with the metal frame MF can enter into an alloy with the metal frame MF situated on the substrate.

Alternatively, a metal layer which melts at less than 300° C. can be fused under pressure. In this case, the pressure p is generated by a stamp coated such that the liquid metal layer M does not wet the stamp. Alternatively, a polymer foil can be situated between liquid metal layer M and stamp, said polymer foil being wetted by the liquid metal if it remains for example as an encryption foil after the closure process in the component.

LIST OF REFERENCE SIGNS

B Bump connection
CH Chip
fol Foil layer
M Metal layer
MF Metal frame
Mfol Multilayer metal foil
ML Metallic closure layer
p Pressure
S Substrate
sp Sawing track
sil Silanization
T Temperature

The invention claimed is:

1. A method for producing a component comprising a substrate, a chip and a frame, comprising the following sequence of steps:
   applying the frame to the substrate;
   connecting the chip to the frame by placing the chip onto the frame; and
   hermetically sealing a volume enclosed by the substrate, the chip and the frame by means of a metallic closure layer,
   wherein the hermetic sealing by means of the metallic closure layer is effected by the metallic closure layer being applied on the frame and the chip over the whole area,
   wherein the closure layer is applied by means of at least one of the following:
   applying metal particles with a plasma jet,
   spraying on metal particles dissolved in a solvent,
   vapor deposition of one or a plurality of metal particles,
   wherein after the metallic closure layer has been applied, the metallic closure layer is sintered.

2. A method for producing a component comprising a substrate, a chip and a frame, comprising the following sequence of steps:
   applying the frame to the substrate;
   connecting the chip to the frame by placing the chip onto the frame; and
   hermetically sealing a volume enclosed by the substrate, the chip and the frame by means of a metallic closure layer, the metallic closure layer being a multilayer metal foil,
   wherein the metallic closure layer is applied to the frame and the chip by means of fusion of the multilayer metal foil with pressurization.

3. The method according to claim 1, wherein the chip has electrically conductive structures on a side inclined toward the enclosed volume and is interconnected with the substrate by means of at least one bump connection.

4. The method according to claim 1 or 2, wherein the frame has a planar surface in such a way that the chip bears homogeneously on the frame.

5. The method according to claim 1 or 2, wherein the chip is a microelectromechanical system, a microelectro optical system, or a microelectro optomechanical system.

6. The method according to claim 1, wherein metal particles, in particular metallic nano or microparticles, are admixed with the plasma jet.

7. The method according to claim 1, wherein the metallic closure layer is reinforced by plating.

* * * * *